(12) United States Patent
Ha

(10) Patent No.: US 8,569,672 B2
(45) Date of Patent: Oct. 29, 2013

(54) PIXEL OF IMAGE SENSOR HAVING ELECTRICALLY CONTROLLABLE PINNING LAYER

(75) Inventor: Man Lyun Ha, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 307 days.

(21) Appl. No.: 13/055,559

(22) PCT Filed: Aug. 19, 2009

(86) PCT No.: PCT/KR2009/004609
§ 371 (c)(1),
(2), (4) Date: Mar. 25, 2011

(87) PCT Pub. No.: WO2010/021486
PCT Pub. Date: Feb. 25, 2010

(65) Prior Publication Data
US 2011/0168873 A1     Jul. 14, 2011

(30) Foreign Application Priority Data

Aug. 20, 2008   (KR) .................. 10-2008-0081296

(51) Int. Cl.
*H01L 27/146* (2006.01)
(52) U.S. Cl.
USPC ............. 250/208.1; 250/214.1; 257/458; 257/E27.133

(58) Field of Classification Search
USPC ............ 250/208.1, 214.1; 257/222, 291, 292, 257/458, E31.084, E27.133
See application file for complete search history.

(56) References Cited

U.S. PATENT DOCUMENTS

| 6,956,273 | B2 | 10/2005 | Koizumi |
| 7,205,627 | B2 * | 4/2007 | Adkisson et al. ............. 257/463 |
| 7,633,134 | B2 | 12/2009 | Hynecek |
| 2003/0189237 | A1 | 10/2003 | Koizumi |
| 2007/0158771 | A1 | 7/2007 | Hynecek |
| 2010/0044812 | A1 | 2/2010 | Hynecek |
| 2010/0044824 | A1 | 2/2010 | Hynecek |

FOREIGN PATENT DOCUMENTS

| JP | 2003-298102 | 10/2003 |
| JP | 2005-167588 | 6/2005 |
| JP | 2006-120804 | 5/2006 |
| KR | 10-1999-0023221 | 3/1999 |
| KR | 10-2007-0072311 | 7/2007 |

OTHER PUBLICATIONS

International Search Report corresponding to International Patent Application No. PCT/KR2009/004609, mailed Mar. 25, 2010.

* cited by examiner

*Primary Examiner* — Kevin Pyo
(74) *Attorney, Agent, or Firm* — McAndrews, Held & Malloy, Ltd.

(57) ABSTRACT

Disclosed are a pinned photodiode having and electrically controllable pinning layer and an image sensor including the pinned photodiode. A predetermined voltage is applied to the pinning layer for the depletion duration of the photodiode in the image sensor, so that stable surface pinning is acquired and the uniform surface pinning is achieved between pixels.

29 Claims, 3 Drawing Sheets

PIXEL OF IMAGE SENSOR HAVING ELECTRICALLY CONTROLLABLE PINNING LAYER

CROSS-REFERENCE TO RELATED APPLICATIONS

The present application is a 35 U.S.C. §371 national stage filing of PCT Application PCT/KR2009/004609, filed Aug. 19, 2009, which claims priority to KR Application 10-2008-0081296, filed Aug. 20, 2008. Each of the above-identified applications are incorporated herein by reference in their entirety.

BACKGROUND OF THE INVENTION

1. Field of the Invention

The present invention relates to a solid image sensor. More particularly, the present invention relates to an image sensor capable of lowering a dark current and forming a uniform depletion layer in all pixels. The present invention is applicable to all kinds of image sensors having a pinned photodiode, and is especially advantageous to a CIS (CMOS Image Sensor).

2. Description of the Prior Art

In general, a CMOS image sensor converts colliding photons into electrons collected in a sensor pixel to detect light. To this end, a pixel of the CMOS image sensor includes a photodiode. Especially, the pixel of the CMOS image sensor includes a pinned photodiode to reduce a dark current and increase the quantity of accumulated charges.

FIG. 1 is a sectional view showing a 4 T pixel having one photodiode and 4 transistors according to the related art and illustrates a related circuit diagram.

Referring to FIG. 1, after forming a p− silicon epi-layer 101 on a p+ silicon substrate 100, the surface of the p− silicon epi-layer 101 is etched, thereby forming an STI (Shallow Trench Isolation) region filled with a silicon dioxide 103. The silicon dioxide 103 covers a remaining pixel surface.

First and second shallow p+ doping regions 104a and 104b serve as a passivation layer for a lower portion and sidewalls of the STI region as well as a pixel surface. The first shallow p+ doping region 104a of the pixel surface serves as a pinning layer of a pinned photodiode, and the second shallow p+ doping region 104b, which is a passivation layer for the lower portion and the sidewalls of the STI region, serves as a potential barrier to prevent crosstalk from occurring between pixels.

If a ground voltage is applied to the p+ silicon substrate 100 and a Vdd voltage is supplied to an n type doping region 105, the n type doping region 105 including a pinned photodiode is fully depleted, so that a depletion region 109 can be formed. In this case, the first shallow p+ doping region 104a serving as the pinning layer prevents the depletion region 109 from being expanded to an interface (that is, the surface of a silicon epi-layer) between silicon and silicon dioxide, thereby blocking a dark current from being generated. In this case, a state in which the depletion region 109 does not reach the silicon surface is called "surface pinning".

Photo-charges are collected in the n type doping region 105 of the pinned photodiode. After the charge collection cycle has been completed, the charges from the n type doping region 105 immediately turn on a gate 107 so that the charges are delivered to an FD (Floating Diffusion) region 106. The FD region 106 is reset to proper potential (e.g., Vdd) by a reset transistor 118. The charges of the FD region 106 are detected by a source follower transistor 114. The pixel is addressed by a selective transistor 115

A control signal is supplied to a pixel through a transfer gate bus (for a signal Tx) 112, a reset gate bus (for a signal Rx) 120, and an address gate bus (for a signal Sx) 121. The output from the pixel is supplied to a pixel column bus 116.

When photons 122 collide on a pixel, the photons 122 are infiltrated into a silicon bulk according to the wavelengths thereof, thereby forming an electron-hole pair. Electrons are generated in a non-depletion region as well as a depletion region 108. Electrons 110 generated from the non-depletion region of silicon are diffused into the n type doping region 105.

However, electrons generated from a neutral non-depletion region may be diffused in a lateral direction. Accordingly, crosstalk may occur between pixels even though the second shallow p+ doping region 104b is formed. Therefore, a depletion region depth (Xc) 111 has to be a proper value.

Meanwhile, as described above, the first shallow p+ doping region 104a, which is a pinning layer, is used for surface pinning. To this end, the doping level of the first shallow p+ doping region 104a has to be optimized. As generally known to those skilled in the art, the depletion layer in a PN junction is determined according to the doping levels of P and N doping layers and potential difference between two doping layers.

However, according to the existing technology, the thickness of the depletion layer is determined only by the doping level, and the pinning layer has ground potential.

However, the pinning layer does not have full ground potential, but is put in a floating state. This is because the pinning layer is spaced apart from the silicon substrate 101 at a predetermined distance by another layer (that is, p epi-layer) having high resistance, and because the resistance of the p epi-layer varies according to the depth of the STI region.

As a result, the pinning layer of the photodiode in a conventional image sensor has unstable potential, so that stable surface pinning cannot be achieved.

In addition, when uniform potential is transferred to the pinning layers in all pixels, uniform surface pinning can be achieved between pixels. However, in the conventional technology, uniform surface pinning between pixels cannot be acquired due to the above reasons.

SUMMARY OF THE INVENTION

The present invention has been made to solve the above problems occurring in the prior art, and an object of the present invention is to provide a pixel of an image sensor, capable of lowering a dark current and performing uniform surface pinning in all pixels.

Another object of the present invention is to provide an image sensor integrated with a unit to forcibly apply a voltage to a pinning layer of a photodiode.

Yet another object of the present invention is to provide an image sensor, capable of supplying a predetermined voltage to a pinning layer while maintaining the area of an existing lay-out surface.

Yet another object of the present invention is to provide an image sensor capable of improving the uniformity of a reset signal between pixels by applying potential having the same intensity to pinning layers of all pixels.

Yet another object of the present invention is to provide an image sensor capable of preventing crosstalk between pixels by supplying a predetermined voltage to a field-stop zone connected to a pinning layer.

In accordance with an aspect of the present invention, there is provided an image sensor including a pinned photodiode having a pinning layer, and a voltage supply unit connected to the pinning layer to apply a predetermined voltage to the pinning layer when the pinned photodiode is depleted.

In accordance with another aspect of the present invention, there is provided a pixel of an image sensor including a pinned photodiode having a pinning layer, a charge transfer transistor for receiving a transfer control signal through a gate terminal thereof to transfer charges accumulated by the pinned photodiode to a sensing node, and a diode connected between the gate terminal of the charge transfer transistor and the pinning layer to apply a predetermined voltage to the pinning layer.

In accordance with yet another aspect of the present invention, there is provided a pixel of an image sensor including a pinned photodiode having a pinning layer, a sensing node for receiving charges accumulated in the pinned photodiode, a reset transistor for receiving a reset control signal through a gate terminal thereof to reset the sensing node, and a diode connected between the gate terminal of the reset transistor and the pinning layer to apply a predetermined voltage to the pinning layer.

As described above, in the image sensor according to the present invention, the pinning layer of the photodiode can be electrically controlled. In other words, the pinning layer is not in a floating state for depletion duration of the photodiode, but receives a predetermined voltage. Accordingly, stable surface pinning can beacquired.

Since uniform voltage is applied to pinning layers of photodiodes in all pixels, uniform pinning between pixels can be acquired. In addition, the uniformity of the reset signal between pixels can be improved.

Since voltage is applied to a field stop doping region, an electric field is formed from a field oxide layer to a substrate, thereby preventing crosstalk.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described with reference to accompanying drawings.

Figure 2:
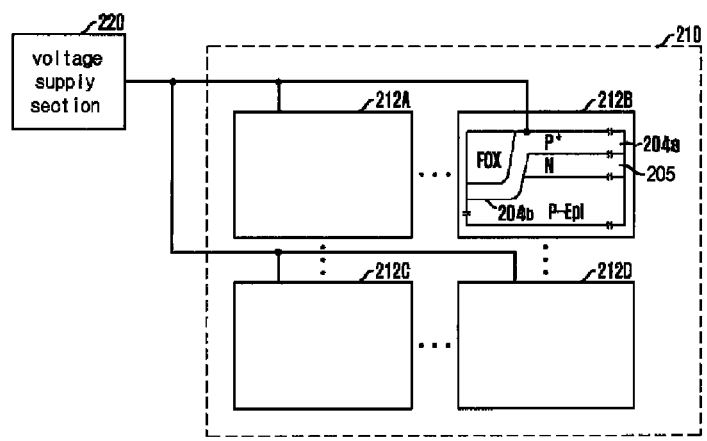
FIG. 2 is a block diagram schematically showing the structure of an image sensor according to one embodiment of the present invention.

FIG. 2 is a block diagram schematically showing the structure of an image sensor according to an embodiment of the present invention.

Referring to FIG. 2, pixels 212A, 212B, 212C, and 212D constituting a pixel array 210 include a pinned photodiode formed by a P+ doping region 204a and an N doping region 205 that are doping regions of a substrate P-Epi. The P+ doping region 204a serves as a pinning layer, and the pinning layer is connected to a lateral surface of a field oxide layer FOX and a field stop doping region 204b under the P+ doping region 204a.

A voltage supply section 220 generates a positive voltage of about 0.5V to about 0.9V and supplies the positive voltage to the pinning layer 204a of the pinned photodiode. The pinning layer 204a receives the positive voltage for a duration at which the pinned photodiode is depleted during the operation of the pixel.

One voltage supply section 220 may be provided for one pixel, or may be provided for a plurality of pixels.

Figure 3:
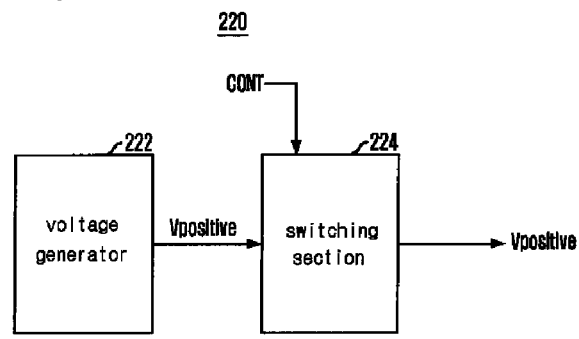
FIG. 3 is a block diagram showing a voltage supply section of FIG. 2 in detail.

FIG. 3 is a detailed view showing the structure of the voltage supply section 220. The voltage supply section 220 includes a voltage generator 222 to generate a positive voltage Vpositive and a switching section to transfer the positive voltage Vpositive to the pinning layer by a control signal CONT. The control signal CONT is activated for the depletion duration of the pinned photodiode. In addition, the control signal CONT represents selection information when a specific pixel is selected from among a plurality of pixels.

In the image sensor according to the present invention, the pinning layer of the photodiode directly receives a predetermined voltage for the depletion duration. The positive voltage has a positive level of about 0.5V to about 0.9V slightly higher than a ground voltage.

Therefore, since the pinning layer is not in a floating state, but receives a predetermined voltage for the depletion duration of the photodiode, the pinning layer can obtain stable surface pinning.

In addition, since a voltage is uniformly applied to pinning layers of photodiodes in all pixels, uniform pining can be represented between pixels.

Since a voltage is applied to a field stop doping region, an electric field is formed from the field oxide layer FOX to the substrate P-Epi, thereby preventing crosstalk. In other words, photo-charges collected in the photodiode can be prevented from leaking to an adjacent pixel before the photo-charges are delivered to a sensing node (that is, floating diffusion node).

Figure 4:
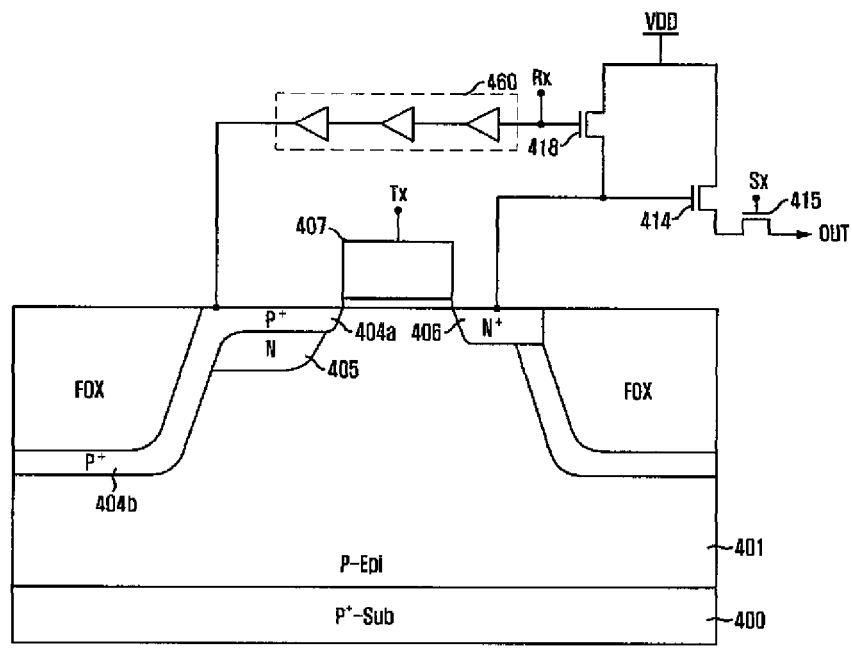
FIG. 4 is a view schematically showing the structure of a pixel of an image sensor according to another embodiment of the present invention.

FIG. 4 is a view showing the structure of a pixel according to another embodiment of the present invention. Referring to FIG. 4, unlike the previous embodiment, diodes are additionally formed in a pixel without an additional voltage generator and an additional switch, so that a positive voltage can be applied to a pinning layer.

Referring to FIG. 4, a P silicon epi-layer 401 is formed on a P+ silicon substrate 400, and field oxide layers FOX are formed in the P silicon epi-layer 401 through an STI (Shallow Trench Isolation) process. In addition, a P+ doping region 404a and an N doping region 405 are formed in the P silicon epi-layer 401, thereby forming a pinned photodiode.

First and second shallow P+ doping regions 404a and 404b serve as passivation layers for a lower portion and sidewalls of the STI region as well as a pixel surface. The first shallow p+ doping region 404a serves as a pinning layer of a pinned photodiode, and the second shallow P+doping region 404b, which is a passivation layer for the lower portion and the sidewalls of the STI region, becomes a field stop doping region serving as a potential barrier to prevent crosstalk from occurring between pixels.

An N+ doping region 406 is formed for a sensing node to receive photo-charges from the pinned photodiode. The sensing node is reset by a reset transistor 418 controlled by a reset control signal Rx. The value of the sensing node is amplified by a source-follower transistor 414, and the amplified signal is delivered to a pixel output line when a selective transistor 415 is turned on by a selective control signal Sx. Photo-charges accumulated in the pinned photodiode are delivered to the N+ doping region 406 by a charge transfer transistor 407 controlled by a transfer control signal Tx.

Diodes are additionally formed between a gate terminal of the reset transistor 418 and the P+ doping region (pinning layer 404*a*) such that a positive voltage is applied to the pinning layer.

When the reset control signal Rx has a VDD voltage level, the reset transistor 418 is turned on. When the reset control signal Rx has a ground level, the reset transistor 418 is turned off.

The pinned photodiode is depleted when the reset transistor 418 is turned on, and the charge transfer transistor 407 is turned on. In other words, since the silicon epi-layer 401 is in a ground state, the VDD voltage is transferred to the N type doping region 405, so that depletion occurs. In this case, since the voltage level of the reset control signal Rx has VDD representing a high state in logic, the reset control signal Rx is down-shifted by a diode section 460, so that the reset control signal Rx is applied at a small positive level to the pinning layer.

Conventionally, the thickness of the depletion layer is determined only by the doping level, and the pinning layer has ground potential. However, the pinning layer does not completely represent the ground potential. This is because the pinning layer is spaced apart from the silicon substrate at a predetermined distance, and separated from the silicon substrate by another layer (that is, P– silicon epi-layer) having high resistance. According to the present invention, since a positive voltage is forcibly applied to the pinning layer, the pinning layer has stable potential. Accordingly, the surface pinning can be more effectively achieved.

In addition, when uniform potential is delivered to the pinning layers of all pixels, superior characteristics can be represented. However, according to the conventional technology, the pinning layers are in the floating state as described above, so that the pixels cannot represent uniform pinning layer potential. According to the present invention, since a positive voltage is applied to the pinning layer for each pixel, the uniform surface pinning between the pixels can be achieved.

In addition, since a voltage is applied to the field stop doping region 404*b*, an electric field is formed from the field oxide layer FOX to the P+ silicon substrate 400, thereby preventing crosstalk.

Figure 5:
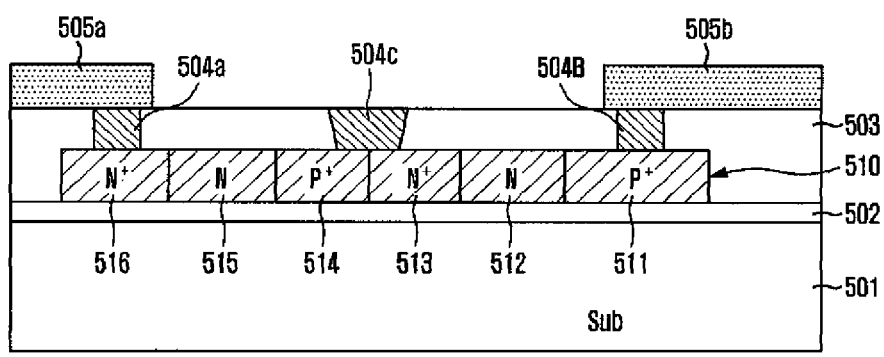
FIG. 5 is a sectional view showing a substrate when a diode section of FIG. 4 includes a polysilicon layer.

FIG. 5 is a sectional view showing a substrate 501 when the diode section 460 of FIG. 4 includes a polysilicon layer.

Referring to FIG. 5, an insulating layer 502 is provided on the substrate 501, and a polysilicon diode 510 is formed on the insulating layer 502. The insulating layer 502 may include a field oxide layer of an isolation region.

The polysilicon diode 510 is formed through a mask and ion implantation process after a polysilicon layer has been deposited. The polysilicon diode 510 has a P+ region 511 and an N region 512, and constitutes one diode through a PN junction of the P+ region 511 and the N region 512. In addition, the polysilicon diode 510 has a P+ region 514 and an N region 515 and constitutes another diode through a PN junction of the P+ region 514 and the N region 515. In such a manner, one polysilicon diode or a plurality of polysilicon diodes may be provided.

The P type region of the polysilicon diode 510 is connected to a gate terminal of a reset transistor, and the N type region of the polysilicon diode 510 is connected to the pinning layer. Specifically, the P+ region 511 is connected to the gate terminal of the reset transistor through a contact 504B and an interconnection 505*b*. In addition, the N+ region 516 is connected to the pinning layer through a contact 504*a* and an interconnection 505*a*. The N+ region 513 and the P+ region 514 are connected to each other through a wide contact 504*c*. Reference number 503 represents an insulating layer.

Figure 6:
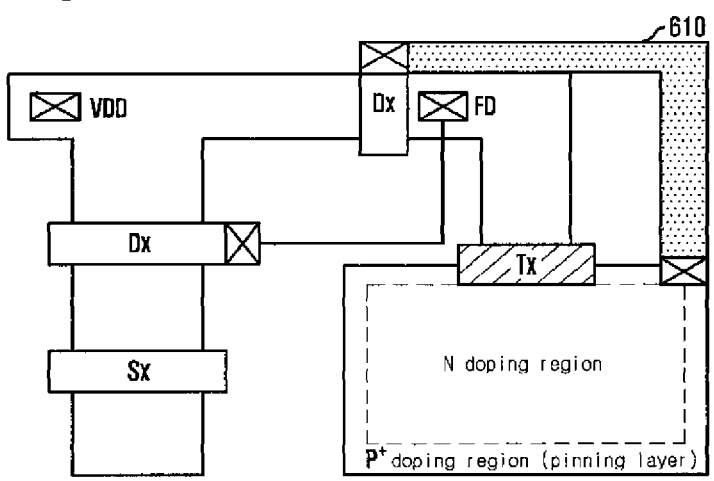
FIG. 6 is a layout view showing the pixel of FIG. 4.

FIG. 6 is a layout view showing the pixel of FIG. 4.

As shown in FIG. 6, a polysilicon diode 610 may be connected to the pinning layer and the gate terminal of the reset transistor without scattering an existing layout. In other words, the positive voltage may be supplied to the pinning layer while maintaining the layout area of an existing pixel layout surface.

Figure 7:
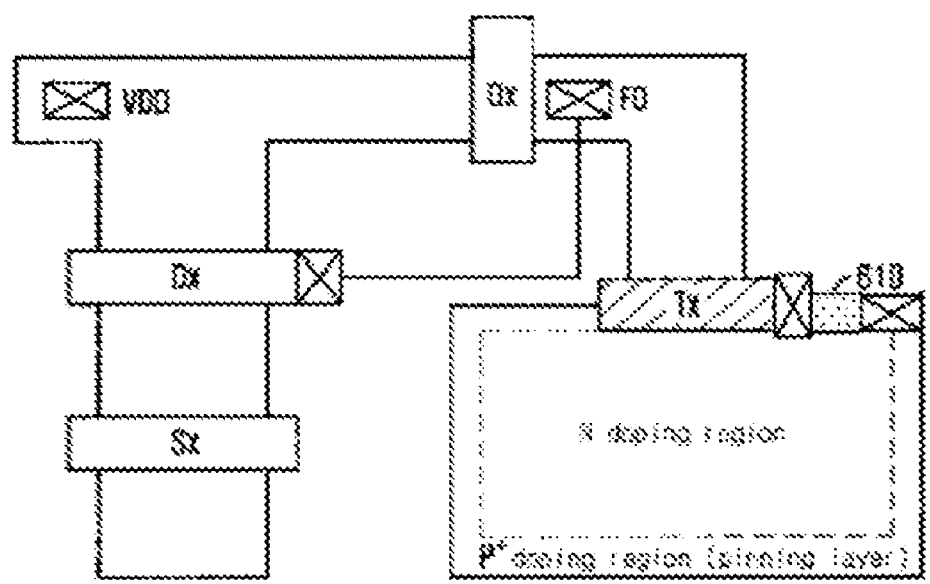
FIG. 7 is a layout view showing a pixel with a diode formed between the gate terminal of the charge transfer transistor and the pinning layer.
Figure 1:
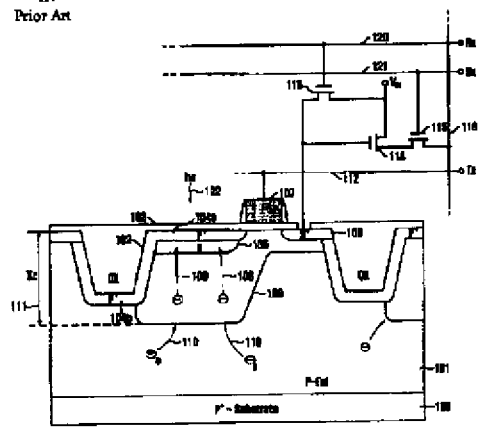
Figure 2:
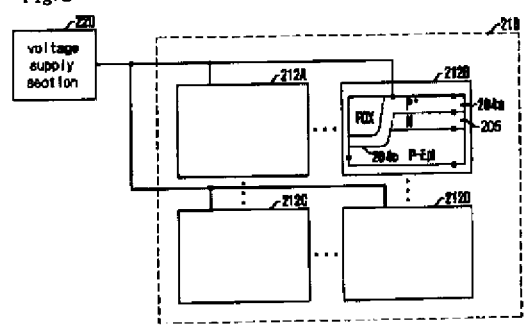
Figure 3:
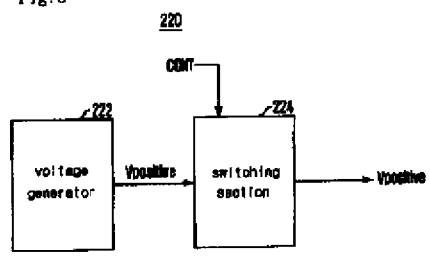
Figure 4:
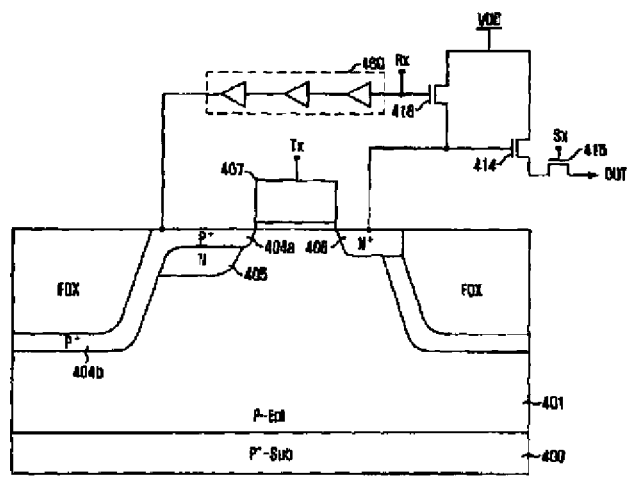
Figure 5:
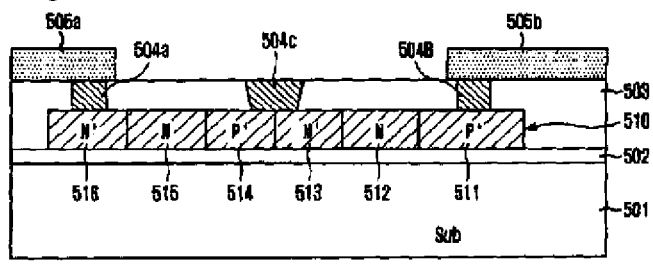
Figure 6:
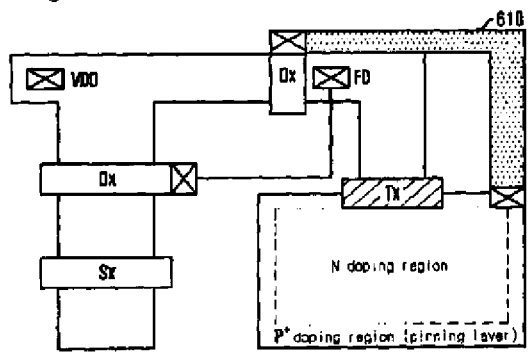
Figure 7:
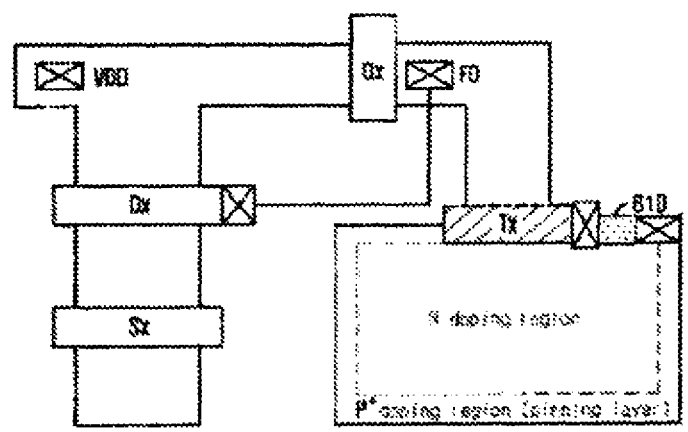

Meanwhile, as described above, the photodiode is depleted when the reset transistor and the charge transfer transistor are turned on. Therefore, according to another embodiment of the present invention shown in FIG. 7, in order to apply the positive voltage to the pinning layer when the photodiode is depleted, a diode may be formed between the gate terminal of the charge transfer transistor and the pinning layer similarly to the embodiments described with reference to FIGS. 4, 5, and 6.

In addition, although the embodiments of the present invention have been described in terms of a 4 T pixel structure, those skilled in the art can sufficiently understand that the present invention is applicable to the 3 T pixel structure because it is generally known to those skilled in the art that the image sensor has a 3 T pixel structure without the charge transfer transistor.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An image sensor, comprising:
  a pinned photodiode having a pinning layer; and
  a voltage supply unit coupled to the pinning layer and configured to apply a predetermined voltage to the pinning layer in response to depletion of the pinned photodiode, wherein the voltage supply unit includes:
    a voltage generator configured to generate the predetermined voltage; and
    a switching unit configured to transfer the predetermined voltage to the pinning layer in response to a switching control signal.

2. The image sensor of claim 1, further comprising a field stop doping region coupled to the pinning layer and configured to receive the predetermined voltage.

3. The image sensor of claim 1, further comprising:
  a pixel array including a plurality of pixels, each pixel having a pinned photodiode;
  wherein the voltage supply unit is configured to apply the predetermined voltage to pinned photodiodes from each pixel in the plurality of pixels.

4. The image sensor of claim 1, wherein the switching control signal is configured to be activated in response to depletion of the pinned photodiode.

5. A pixel of an image sensor, the pixel comprising:
a pinned photodiode having a pinning layer;
a charge transfer transistor including a gate terminal configured to receive a transfer control signal, wherein the charge transfer transistor is configured to transfer charges accumulated by the pinned photodiode to a sensing node in response to the transfer control signal; and
a diode coupled between the gate terminal of the charge transfer transistor and the pinning layer and configured to apply a predetermined voltage to the pinning layer.

6. The pixel of claim 5, further comprising a field stop doping region coupled to the pinning layer and configured to receive the predetermined voltage.

7. The pixel of claim 5, wherein the diode comprises at least two diodes coupled in series.

8. The pixel of claim 5, wherein the diode is further configured to receive a voltage input applied to the gate terminal of the charge transfer transistor, lower the received voltage input, and apply the lowered voltage input to the pinning layer.

9. The pixel of claim 5, wherein the diode comprises a PN-junction polysilicon layer including a P-type region formed at a side of the gate terminal of the charge transfer transistor and an N-type region formed at the pinning layer.

10. The pixel of claim 5, further comprising a reset transistor including a gate terminal configured to receive a reset control signal, wherein the reset transistor is configured to reset the sensing node in response to the reset control signal.

11. The pixel of claim 10, further comprising a selective transistor configured to transfer an output of a source follower transistor to a pixel output line.

12. The pixel of claim 5, further comprising a source follower transistor coupled to the sensing node.

13. A pixel of an image sensor, the pixel comprising:
a pinned photodiode having a pinning layer;
a sensing node configured to receive charges accumulated in the pinned photodiode;
a reset transistor including a gate terminal configured to receive a reset control signal, wherein the reset transistor is configured to reset the sensing node in response to the reset control signal; and
a diode coupled between the gate terminal of the reset transistor and the pinning layer and configured to apply a predetermined voltage to the pinning layer.

14. The pixel of claim 13, further comprising a field stop doping region coupled to the pinning layer and configured to receive the predetermined voltage.

15. The pixel of claim 13, wherein the diode comprises at least two diodes coupled in series.

16. The pixel of claim 13, wherein the diode is further configured to receive a voltage input applied to the gate terminal of the reset transistor, lower the received voltage input, and apply the lowered voltage input to the pinning layer.

17. The pixel of claim 13, wherein the diode comprises a PN-junction polysilicon layer including a P-type region formed at a side of the gate terminal of the reset transistor and an N-type region formed at the pinning layer.

18. The pixel of claim 13, further comprising a source follow transistor coupled to the sensing node.

19. The pixel of claim 18, further comprising a selective transistor configured to transfer an output of the source follower transistor to a pixel output line.

20. The pixel of claim 13, further comprising a charge transfer transistor configured to transfer charges from the pinned photodiode to the sensing node in response to a transfer control signal.

21. A method, comprising:
etching an upper surface of an epitaxial layer to form an isolation region having sidewalls and a lower portion;
forming a photodiode including a first doping region having a first conductivity type and a second doping region having a second conductivity type, wherein the first doping region comprises a pinning layer positioned along the upper surface of the epitaxial layer and a field stop region positioned along the sidewalls and the lower portion of the isolation region; and
forming a diode configured to apply a voltage to the first doping region.

22. The method of claim 21, further comprising:
forming a sensing node in the epitaxial layer; and
forming a gate of a transfer transistor on the upper surface of the epitaxial layer between the photodiode and the sensing node;
wherein said forming a diode comprises forming the diode such that the diode couples the gate of the transfer transistor to the pinning layer.

23. The method of claim 21, further comprising:
forming a sensing node in the epitaxial layer; and
forming a reset transistor configured to reset the sensing node in response to a signal applied to a gate of the reset transistor;
wherein said forming a diode comprises forming the diode such that the diode couples the gate of the reset transistor to the pinning layer.

24. The method of claim 21, wherein said forming a diode comprises:
depositing a polysilicon layer;
masking the polysilicon layer and performing an ion implantation process to form a first region having the first conductivity type; and
masking the polysilicon layer and performing an ion implantation process to form, adjacent to the first region, a second region having the second conductivity type.

25. The method of claim 21, wherein said forming a diode comprises forming the diode as a plurality of diodes coupled in series by:
depositing a polysilicon layer;
masking the polysilicon layer and performing an ion implantation process to form a plurality of first regions having the first conductivity type; and
masking the polysilicon layer and performing an ion implantation process to form, interlaced with the plurality of first regions, a plurality of second regions having the second conductivity type.

26. A method, comprising:
generating a control signal;
depleting a photodiode of an image sensor pixel in response to said generating a control signal;
developing a voltage from the control signal; and
applying the voltage developed from the control signal to a pinning layer of the photodiode in response to said generating a control signal.

27. The method of claim 26, further comprising transferring charge from the photodiode to a sensing node in response to a transfer control signal, wherein:
the control signal comprises the transfer control signal; and
said depleting occurs in response to said transferring.

28. The method of claim 26, further comprising resetting, in response to a reset control signal, a voltage level of a sensing node used to receive charge collected by the photodiode, wherein:

the control signal comprises the reset control signal; and
said depleting occurs in response to said resetting.

29. The method of claim 26, wherein said applying further comprises applying the voltage developed from the control signal to a field stop doping region positioned between the photodiode and a photodiode of an adjacent image sensor pixel.

* * * * *

UNITED STATES PATENT AND TRADEMARK OFFICE
CERTIFICATE OF CORRECTION

PATENT NO. : 8,569,672 B2
APPLICATION NO. : 13/055559
DATED : October 29, 2013
INVENTOR(S) : Ha It is certified that error appears in the above-identified patent and that said Letters Patent is hereby corrected as shown below:

In the Drawings

Figure 1:
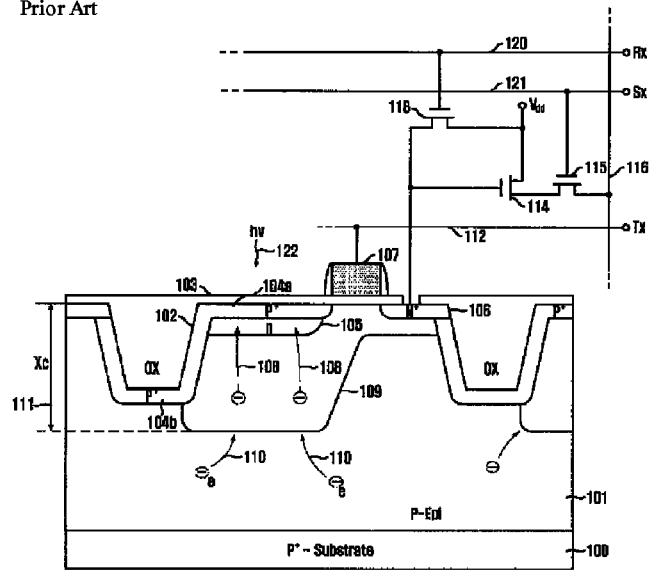
FIG. 1 is a view showing the structure of a 4 T pixel according to the related art.

In Fig. 1, Sheet 1 of 3, delete "Fig" and insert -- Fig. --, therefor at each occurrence throughout the Drawing Sheets attached.

In the Specifications

In Column 2, Line 3, delete "115" and insert -- 115. --, therefor.

In Column 3, Line 29, delete "beacquired." and insert -- be acquired. --, therefor.

In Column 3, Line 56, delete "layer; and" and insert -- layer; --, therefor.

In Column 3, Line 57, delete "Fig. 4." and insert -- Fig. 4; and --, therefor.

In Column 4, Line 63, delete "P+doping" and insert -- P+ doping --, therefor.

Signed and Sealed this
Twenty-fifth Day of March, 2014

Michelle K. Lee
*Deputy Director of the United States Patent and Trademark Office*